US010301581B2

United States Patent
Aoyama et al.

(10) Patent No.: US 10,301,581 B2
(45) Date of Patent: May 28, 2019

(54) LIQUID COMPOSITION FOR CLEANING SEMICONDUCTOR DEVICE, METHOD FOR CLEANING SEMICONDUCTOR DEVICE, AND METHOD FOR FABRICATING SEMICONDUCTOR DEVICE

(71) Applicant: MITSUBISHI GAS CHEMICAL COMPANY, INC., Tokyo (JP)

(72) Inventors: Kimihiro Aoyama, Tokyo (JP); Nobuo Tajima, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 91 days.

(21) Appl. No.: 15/284,926

(22) Filed: Oct. 4, 2016

(65) Prior Publication Data

US 2017/0101607 A1    Apr. 13, 2017

(30) Foreign Application Priority Data

Oct. 8, 2015    (JP) .................. 2015-199887

(51) Int. Cl.
| | | |
|---|---|---|
| C11D 3/04 | (2006.01) | |
| C11D 3/06 | (2006.01) | |
| C11D 3/39 | (2006.01) | |
| C11D 3/395 | (2006.01) | |
| C11D 11/00 | (2006.01) | |
| C11D 3/33 | (2006.01) | |
| C11D 3/00 | (2006.01) | |

(Continued)

(52) U.S. Cl.
CPC ........ *C11D 11/0047* (2013.01); *C11D 3/0073* (2013.01); *C11D 3/044* (2013.01); *C11D 3/33* (2013.01); *C11D 3/3902* (2013.01); *C11D 3/3942* (2013.01); *C11D 3/3947* (2013.01); *C11D 7/04* (2013.01); *C11D 7/06* (2013.01); *C11D 7/10* (2013.01); *C11D 7/36* (2013.01); *H01L 21/02068* (2013.01); *H01L 21/32134* (2013.01); *H01L 21/31144* (2013.01)

(58) Field of Classification Search
CPC ............ C11D 3/04; C11D 3/044; C11D 3/33; C11D 3/3902; C11D 3/3942
USPC ................ 510/175, 176, 370, 480, 499, 508
See application file for complete search history.

(56) References Cited

U.S. PATENT DOCUMENTS

| | | | |
|---|---|---|---|
| 7,135,445 B2 * | 11/2006 | Charm ................. | C11D 7/3218 510/175 |
| 7,977,292 B2 | 7/2011 | Matsunaga et al. | |

(Continued)

FOREIGN PATENT DOCUMENTS

| | | |
|---|---|---|
| JP | 2002-266087 | 9/2002 |
| JP | 2003-234307 | 8/2003 |

(Continued)

*Primary Examiner* — Gregory R Delcotto
(74) *Attorney, Agent, or Firm* — Greenblum & Bernstein, P.L.C.

(57) ABSTRACT

Liquid cleaning compositions for removing a titanium nitride hard mask while suppressing damage to copper, a copper alloy, cobalt or a cobalt alloy upon fabricating a semiconductor device, a cleaning method using the same, and a method for fabricating a semiconductor device, which comprise hydrogen peroxide at 1-30% by mass, potassium hydroxide at 0.01-1% by mass, aminopolymethylene phosphonic acid at 0.0001-0.05% by mass, a compound having a group 13 element at 0.00005-0.5% by mass, and water.

15 Claims, 1 Drawing Sheet

(51) Int. Cl.
*C11D 7/04* (2006.01)
*C11D 7/06* (2006.01)
*C11D 7/36* (2006.01)
*H01L 21/02* (2006.01)
*H01L 21/3213* (2006.01)
*C11D 7/10* (2006.01)
*H01L 21/311* (2006.01)

(56) References Cited

U.S. PATENT DOCUMENTS

| | | | |
|---|---|---|---|
| 8,906,838 B2 | 12/2014 | Hsu | |
| 9,422,512 B2* | 8/2016 | Shimada | G03F 7/425 |
| 2005/0176602 A1 | 8/2005 | Hsu | |
| 2010/0029085 A1* | 2/2010 | Matsunaga | G03F 7/423 |
| | | | 438/737 |
| 2014/0374904 A1 | 12/2014 | Matsumoto et al. | |
| 2015/0210966 A1* | 7/2015 | Shimada | C23G 1/20 |
| | | | 438/703 |
| 2015/0243527 A1 | 8/2015 | Muro et al. | |
| 2015/0265645 A1 | 9/2015 | Ohara et al. | |

FOREIGN PATENT DOCUMENTS

| | | |
|---|---|---|
| JP | 2005-529363 | 9/2005 |
| JP | 2010-232486 | 10/2010 |
| JP | 2013-187350 | 9/2013 |
| JP | 2014-84489 | 5/2014 |
| JP | 2014-93407 | 5/2014 |
| JP | 2014-99498 | 5/2014 |
| JP | 2014-99559 | 5/2014 |
| JP | 2014-146623 | 8/2014 |
| WO | 2008/114616 | 9/2008 |
| WO | 2014/087925 | 6/2014 |
| WO | 2015/122250 | 8/2015 |

* cited by examiner

LIQUID COMPOSITION FOR CLEANING SEMICONDUCTOR DEVICE, METHOD FOR CLEANING SEMICONDUCTOR DEVICE, AND METHOD FOR FABRICATING SEMICONDUCTOR DEVICE

TECHNICAL FIELD

The present invention relates to a liquid composition for cleaning a semiconductor device used in a process of fabricating a semiconductor integrated circuit, a method for cleaning a semiconductor device using the same and a method for fabricating a semiconductor.

BACKGROUND ART

Generally, a highly integrated semiconductor device is fabricated by a series of steps comprising:

forming a conductive thin film such as a metal film or the like as a conductive wiring material and an interlayer dielectric film for insulating between the conductive thin films on an element such as a silicon wafer, and then uniformly applying a photoresist onto the surface of the resultant to provide a photosensitive layer, which is subjected to selective exposure and development to form a desired photoresist pattern; then, conducting dry etch treatment of the interlayer dielectric film using this photoresist pattern as a mask to form a desired pattern on the thin film; and, completely removing the photoresist pattern as well as the residue resulting from the dry etch treatment (hereinafter, referred to as a "dry etch residue") by oxygen plasma ashing, use of a cleaning solution, or the like.

Recently, along with more shrunken design rules, RC delay is becoming to get on top of the limitation of high-speed arithmetic processing. Accordingly, the interlayer dielectric film is making a shift from a silicon oxide film to a low-dielectric-constant interlayer dielectric film (a film with a dielectric constant of less than 3: hereinafter, referred to as a "low-dielectric-constant interlayer dielectric film"). Moreover, when a pattern of 0.2 μm or less is to be formed, a photoresist with a film thickness of 1 μm will result the aspect ratio of the pattern (a ratio obtained by dividing the thickness of the photoresist film by the line width of the photoresist) to be too large, causing problems such as destruction of the pattern. In order to solve this, a hard mask technique is sometimes employed, in which a film of a titanium (Ti) series, a silicon (Si) series or the like (hereinafter, referred to as a "hard mask") is inserted between the pattern film that is to be actually formed and the photoresist film so as to first transfer the photoresist pattern onto the hard mask by dry etch. Once the photoresist is removed, this hard mask is used as an etch mask to transfer the pattern onto the film that is to be actually formed by dry etch. According to this method, since the gas used upon etching the hard mask is exchangeable with the gas used upon etching the film that is to be actually formed, one can select a gas that ensures selectivity between the photoresist and the hard mask upon etching the hard mask, and a gas that ensures selectivity between the hard mask and the film to be actually etched upon etching the actual film. Therefore, it is advantageous in that a pattern can be formed while causing minimum damage to the actual film.

Furthermore, since the current density of metal wiring has been increasing due to more shrunken design rules, a countermeasure is strongly required against electromigration, i.e., transport of a metal wiring material caused by the current flowing through the metal wiring material, which causes a hole in the metal wiring. As such countermeasures, there are methods in which cobalt or a cobalt alloy is formed as a cap metal on copper wiring, and methods in which cobalt or a cobalt alloy is used as a metal wiring material as described in Patent Literature 1. Accordingly, in addition to conventional copper wiring, cobalt and cobalt alloys have also become targets of damage suppression.

Accordingly, there has been a need for a method for removing a hard mask while suppressing damage to copper, copper alloys, cobalt and cobalt alloys upon fabricating a semiconductor device. In this regard, various techniques have been proposed.

Patent Literature 2 proposes a cleaning method that uses a cleaning composition comprising hydrogen peroxide, aminopolymethylene phosphonic acids, potassium hydroxide and water.

Patent Literature 3 proposes an etch composition having pH greater than 8.5 and comprising at least one selected from the group consisting of ammonia, a compound having an amino group and a compound having a ring structure containing a nitrogen atom, as well as hydrogen peroxide in an aqueous medium.

Patent Literature 4 proposes a cleaning composition comprising: a polar organic solvent selected from the group consisting of dimethylpiperidone, sulfones and sulfolanes; an alkali base selected from the group consisting of tetraalkylammonium hydroxide, choline hydroxide, sodium hydroxide and potassium hydroxide; water; a chelating agent or a metal complexing agent selected from the group consisting of trans-1,2-cyclohexanediamine tetraacetic acid, ethane-1-hydroxy-1,1-diphosphonate and ethylenediamine tetra(methylene phosphonic acid).

Patent Literature 5 proposes a method for cleaning a semiconductor device in which an aqueous sulfuric acid solution at 70° C. or higher is used for cleaning so that titanium nitride (TiN) film can be removed without etching cobalt (Co) silicide.

Patent Literature 6 proposes an etchant comprising a hexafluorosilicic acid compound and an oxidant.

Patent Literature 7 proposes an etchant comprising a halogen compound such as hydrochloric acid, an oxidant, and a metal layer anticorrosive selected from nitrogen-containing heteroaromatic compounds, quaternary onium compounds and the like.

Patent Literature 8 proposes an etch method in which an etchant comprising a fluorine compound such as hydrofluoric acid and an oxidant is applied to remove a layer containing titanium nitride (TiN) without removing a transition metal layer.

Patent Literature 9 proposes an etch method in which an etchant comprising an organic onium compound and an oxidant is applied to remove a layer containing titanium nitride (TiN) without removing a transition metal layer.

Patent Literature 10 proposes an etch method in which an etchant having pH of 1 or higher and comprising a specific fluorine compound selected from the group consisting of a metal salt of hydrofluoric acid and an ammonium salt of hydrofluoric acid, as well as an oxidant is used to preferentially remove a layer containing titanium nitride (TiN) rather than a layer containing a transition metal.

CITATION LIST

Patent Literature

[Patent Literature 1] Japanese Unexamined Patent Application Publication No. 2013-187350

[Patent Literature 2] International Publication No. 2008/114616
[Patent Literature 3] Japanese Unexamined Patent Application Publication No. 2010-232486
[Patent Literature 4] Japanese Unexamined Patent Application (Translation of PCT) Publication No. 2005-529363
[Patent Literature 5] Japanese Unexamined Patent Application Publication No. 2003-234307
[Patent Literature 6] Japanese Unexamined Patent Application Publication No. 2014-84489
[Patent Literature 7] Japanese Unexamined Patent Application Publication No. 2014-93407
[Patent Literature 8] Japanese Unexamined Patent Application Publication No. 2014-99498
[Patent Literature 9] Japanese Unexamined Patent Application Publication No. 2014-99559
[Patent Literature 10] Japanese Unexamined Patent Application Publication No. 2014-146623

SUMMARY OF INVENTION

Technical Problem

Recently, however, along with more shrunken design rules, a requirement for suppression of damage to a metal wiring material has become more relentless. In response to such a requirement, the present inventors have gone through intensive studies, and as a result of which found that the compositions and the methods described in Patent Literatures 2-10 have various technical tasks and problems as described below.

The liquid cleaning composition described in Patent Literature 2 (a cleaning composition comprising hydrogen peroxide, aminopolymethylene phosphonic acids, potassium hydroxide and water) cannot sufficiently suppress the damage to copper and cobalt, and thus cannot be used for the intended purpose (see Comparative Example 1).

The etch composition described in Patent Literature 3 (an etch composition having pH greater than 8.5 and comprising at least one selected from the group consisting of ammonia, a compound having an amino group and a compound having a ring structure containing a nitrogen atom, as well as hydrogen peroxide in an aqueous medium) is insufficient to remove the TiN hard mask and cannot sufficiently suppress damage to copper. Therefore, it cannot be used for the intended purpose (see Comparative example 2).

The cleaning composition described in Patent Literature 4 (a cleaning composition comprising: a polar organic solvent selected from the group consisting of dimethylpiperidone, sulfones, sulfolanes and the like; an alkali base selected from the group consisting of tetraalkylammonium hydroxide, choline hydroxide, sodium hydroxide, potassium hydroxide and the like; water; and a chelating agent or a metal complexing agent selected from the group consisting of trans-1,2-cyclohexanediamine tetraacetic acid, ethane-1-hydroxy-1,1-diphosphonate, ethylenediamine tetra(methylene phosphonic acid) and the like, etc.) cannot sufficiently suppress damage to copper and cobalt. Therefore, it cannot be used for the intended purpose (see Comparative Example 3).

The aqueous sulfuric acid solution described in Patent Literature 5 (an aqueous sulfuric acid solution at a temperature of 70° C. or higher) is insufficient to remove the TiN hard mask, and cannot sufficiently suppress damage to copper and cobalt. Therefore, it cannot be used for the intended purpose (see Comparative Example 4).

The etchant described in Patent Literature 6 (an etchant comprising a hexafluorosilicic acid compound and an oxidant) is insufficient to remove the TiN hard mask, and cannot sufficiently suppress damage to copper and cobalt. Therefore, it cannot be used for the intended purpose (see Comparative example 5).

The etchant described in Patent Literature 7 (an etchant comprising a halogen compound such as hydrochloric acid, an oxidant, and a metal layer anticorrosive selected from a nitrogen-containing heteroaromatic compound, a quaternary onium compound and the like) is insufficient to remove the TiN hard mask, and cannot sufficiently suppress damage to copper and cobalt. Therefore, it cannot be used for the intended purpose (see Comparative example 6).

The etch method described in Patent Literature 8 (which uses an etchant comprising a fluorine compound such as hydrofluoric acid and an oxidant) cannot sufficiently suppress damage to copper and cobalt. Therefore, it cannot be used for the intended purpose (see Comparative example 7).

The etch method described in Patent Literature 9 (which uses an etchant comprising an organic onium compound and an oxidant) cannot sufficiently suppress damage to copper and cobalt. Therefore, it cannot be used for the intended purpose (see Comparative example 8).

The etchant described in Patent Literature 10 (an etchant having pH of 1 or more and comprising a specific fluorine compound selected from the group consisting of a metal salt of hydrofluoric acid and an ammonium salt of hydrofluoric acid, as well as an oxidant) is insufficient to remove the TiN hard mask. Therefore, it cannot be used for the intended purpose (see Comparative example 9).

The objective of the present invention is to provide a liquid cleaning composition for removing a TiN hard mask while suppressing damage to copper, a copper alloy, cobalt or a cobalt alloy upon fabricating a semiconductor device, a cleaning method using the same, and a semiconductor device obtained by employing said method.

Solution to Problem

The present invention provides a method for solving the above-described problems. The present invention is as follows.

1. A liquid cleaning composition for removing a titanium nitride hard mask while suppressing corrosion of one or more types of materials selected from the group consisting of a material containing a cobalt element and a material containing a copper element, the composition comprising hydrogen peroxide at 1-30% by mass, potassium hydroxide at 0.01-1% by mass, aminopolymethylene phosphonic acid at 0.0001-0.05% by mass, a compound having a group 13 element at 0.00005-0.5% by mass and water.

2. The liquid cleaning composition according to Item 1, wherein the compound having a group 13 element is one or more types selected from the group consisting of salts of aluminum and salts of gallium.

3. The liquid cleaning composition according to Item 1, wherein the compound having a group 13 element is one or more types selected from the group consisting of aluminum sulfate, aluminum nitrate, aluminum chloride, aluminum lactate and gallium nitrate.

4. The liquid cleaning composition according to Item 1, wherein the aminopolymethylene phosphonic acid is one or more types selected from the group consisting of aminotris (methylene phosphonic acid), ethylenediamine tetra(methylene phosphonic acid), diethylenetriamine penta(methylene phosphonic acid) and 1,2-propylenediamine tetra(methylene phosphonic acid).

5. The liquid cleaning composition according to Item 1, wherein the material containing a cobalt element is cobalt or a cobalt alloy and the material containing a copper element is copper or a copper alloy.

6. A cleaning method for removing a titanium nitride hard mask by using a liquid cleaning composition while suppressing corrosion of one or more materials selected from a material containing a cobalt element and a material containing a copper element, wherein the liquid cleaning composition comprises hydrogen peroxide at 1-30% by mass, potassium hydroxide at 0.01-1% by mass, aminopolymethylene phosphonic acid at 0.0001-0.05% by mass, a compound having a group 13 element at 0.00005-0.5% by mass and water. Specifically, a semiconductor device cleaning method for removing a titanium nitride hard mask while suppressing corrosion of one or more types of materials selected from the group consisting of a material containing a cobalt element and a material containing a copper element, where the semiconductor device has at least one or more types of materials selected from the group consisting of a material containing a cobalt element and a material containing a copper element as well as a titanium nitride hard mask, the method comprising a step of bringing a liquid cleaning composition comprising hydrogen peroxide at 1-30% by mass, potassium hydroxide at 0.01-1% by mass, aminopolymethylene phosphonic acid at 0.0001-0.05% by mass, a compound having a group 13 element at 0.00005-0.5% by mass and water into contact with the semiconductor device.

7. The cleaning method according to Item 6, wherein the compound having a group 13 element is one or more types selected from the group consisting of salts of aluminum and salts of gallium.

8. The cleaning method according to Item 6, wherein the compound having a group 13 element is one or more types selected from the group consisting of aluminum sulfate, aluminum nitrate, aluminum chloride, aluminum lactate and gallium nitrate.

9. The cleaning method according to Item 6, wherein the aminopolymethylene phosphonic acid is one or more types selected from the group consisting of aminotris(methylene phosphonic acid), ethylenediamine tetra(methylene phosphonic acid), diethylenetriamine penta(methylene phosphonic acid) and 1,2-propylenediamine tetra(methylene phosphonic acid).

10. The cleaning method according to Item 6, wherein the material containing a cobalt element is cobalt or a cobalt alloy and the material containing a copper element is copper or a copper alloy.

11. A method for fabricating a semiconductor device having one or more types of materials selected from the group consisting of a material containing a cobalt element and a material containing a copper element, the method comprising a step of removing a titanium nitride hard mask while suppressing corrosion of one or more types of materials selected from the group consisting of a material containing a cobalt element and a material containing a copper element by using a liquid cleaning composition comprising hydrogen peroxide at 1-30% by mass, potassium hydroxide at 0.01-1% by mass, aminopolymethylene phosphonic acid at 0.0001-0.05% by mass, a compound having a group 13 element at 0.00005-0.5% by mass and water.

12. The fabrication method according to Item 11, wherein the compound having a group 13 element is one or more types selected from the group consisting of salts of aluminum and salts of gallium.

13. The fabrication method according to Item 11, wherein the compound having a group 13 element is one or more types selected from the group consisting of aluminum sulfate, aluminum nitrate, aluminum chloride, aluminum lactate and gallium nitrate.

14. The fabrication method according to Item 11, wherein the aminopolymethylene phosphonic acid is one or more types selected from the group consisting of aminotris(methylene phosphonic acid), ethylenediamine tetra(methylene phosphonic acid), diethylenetriamine penta(methylene phosphonic acid) and 1,2-propylenediamine tetra(methylene phosphonic acid).

15. The fabrication method according to Item 11, wherein the material containing a cobalt element is cobalt or a cobalt alloy and the material containing a copper element is copper or a copper alloy.

Advantageous Effects of Invention

A liquid cleaning composition and a cleaning method of the present invention can be used to remove a titanium nitride (TiN) hard mask on a surface of a treated product while suppressing damage to metal wiring and a cobalt (Co) cap metal during the process of fabricating a semiconductor device, thereby fabricating a high-precision high-quality semiconductor device at good yield.

DESCRIPTION OF EMBODIMENTS

A liquid cleaning composition of the present invention (hereinafter, sometimes simply referred to as a "cleaning solution") contains hydrogen peroxide, potassium hydroxide, aminopolymethylene phosphonic acid, a compound having a group 13 element, and water.

Since the liquid semiconductor cleaning composition of the present invention for removing a TiN hard mask is used during the process of fabricating a semiconductor device, damage to metal wiring must be suppressed.

The concentration range of hydrogen peroxide used with the present invention is 1-30% by mass, preferably 3-25% by mass and particularly preferably 10-25% by mass. As long as the concentration is within the above-mentioned range, the TiN hard mask can effectively be removed while suppressing damage to the metal wiring.

The concentration range of potassium hydroxide used with the present invention is 0.01-1% by mass, preferably 0.05-0.7% by mass and particularly preferably 0.07-0.5% by mass. As long as the concentration is within the above-mentioned range, the TiN hard mask can effectively be removed while suppressing damage to the metal wiring.

Examples of aminopolymethylene phosphonic acid used with the present invention include aminotris(methylene phosphonic acid), ethylenediamine tetra(methylene phosphonic acid), diethylenetriamine penta(methylene phosphonic acid) and 1,2-propylenediamine tetra(methylene phosphonic acid). These aminopolymethylene phosphonic acids may be used alone or two or more types of them may be used in combination.

The concentration range of the aminopolymethylene phosphonic acid used with the present invention is 0.0001-0.05% by mass, preferably 0.0003-0.01% by mass and particularly preferably 0.0005-0.005% by mass. As long as the concentration is within the above-mentioned range, damage to the metal wiring can effectively be suppressed.

Examples of the compound having a group 13 element used with the present invention include sulfate, nitrate, hydrochloride or lactate of aluminum or gallium, where it is preferably aluminum sulfate, aluminum nitrate, aluminum chloride, aluminum lactate or gallium nitrate. These compounds having a group 13 element may be added alone or two or more of them may be added in combination.

The concentration range of the compound having a group 13 element used with the present invention is 0.00005-0.5% by mass, preferably 0.0001-0.1% by mass and particularly preferably 0.01-0.07% by mass. As long as the concentration is within the above-mentioned range, damage to the metal wiring can effectively be suppressed.

If desired, the liquid cleaning composition of the present invention may be added with an additive that is conventionally used in a liquid composition for cleaning a semiconductor within a range that does not impair the purpose of the present invention. For example, a surfactant, an antifoaming agent or the like may be added as such an additive.

If desired, the liquid cleaning composition of the present invention may be added with an azole within a range that does not impair the purpose of the present invention.

Specifically, as such an azole, but without limitation, one or more types of azoles selected from 1-methylimidazole, 1-vinylimidazole, 2-phenylimidazole, 2-ethyl-4-imidazole, N-benzyl-2-methylimidazole, 2-methylbenzimidazole, pyrazole, 4-methylpyrazole, 3,5-dimethylpyrazole, 1,2,4-triazole, 1H-benzotriazole, 5-methyl-1H-benzotriazole and 1H-tetrazole are preferable and 3,5-dimethylpyrazole are particularly preferable.

The cleaning method of the present invention removes a titanium nitride hard mask from a semiconductor device that has a material selected from the group consisting of a material containing a cobalt element and a material containing a copper element, as well as a TiN titanium hard mask, while suppressing corrosion of the material selected from the group consisting of a material containing a cobalt element and a material containing a copper element, where the method comprises a step of bringing the liquid cleaning composition of the present invention into contact with the semiconductor device. Herein, the phrase "suppressing corrosion of a material selected from the group consisting of a material containing a cobalt element and a material containing a copper element" means that the etch rate of said material is 0.1 Å/min (0.01 nm/min) or less.

The method for bringing the liquid cleaning composition of the present invention into contact with the semiconductor device is not particularly limited. For example, the method employed may be a method in which the semiconductor device is immersed in the liquid cleaning composition of the present invention or a method in which the semiconductor device is brought into contact with the liquid cleaning composition by dropping, spraying or the like.

The temperature of the liquid cleaning composition of the present invention upon use is preferably in a range of 20-80° C., more preferably in a range of 25-70° C. and particularly preferably in a range of 40-60° C., which may suitably be selected according to etch conditions and a semiconductor base used.

If necessary, the cleaning method of the present invention may also employ ultrasonication in combination.

The time of use of the liquid cleaning composition of the present invention is preferably in a range of 0.3-30 minutes, more preferably in a range of 0.5-20 minutes and particularly preferably in a range of 1-10 minutes, which may suitably be selected according to etch conditions and a semiconductor base used.

Although a rinsing liquid that is used after the use of the liquid cleaning composition of the present invention may be an organic solvent such as an alcohol, it is also sufficient to simply rinse with water.

Figure 1:
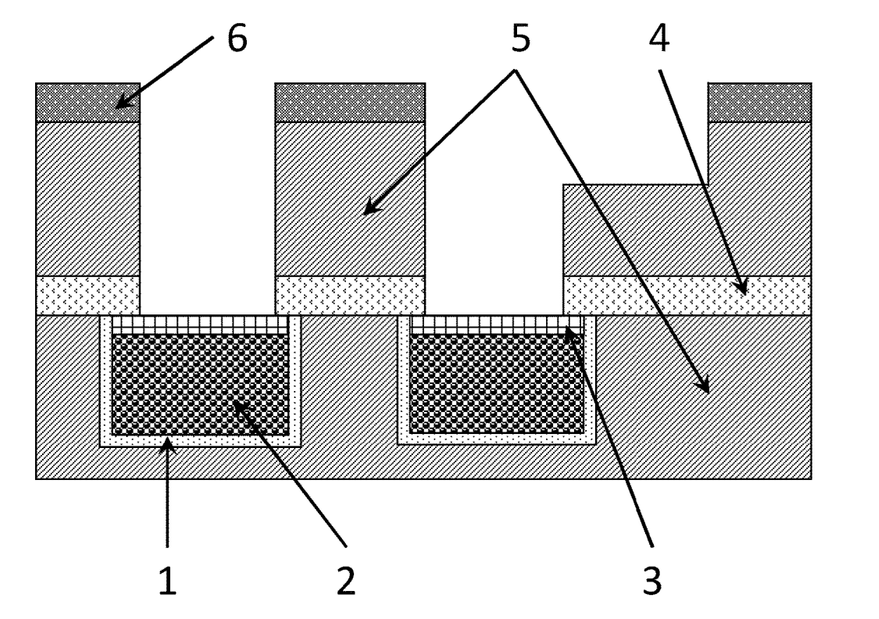
FIG. 1 A schematic cross-sectional view of a semiconductor device comprising a barrier metal, metal wiring, a cap metal, a barrier dielectric film, a low-dielectric-constant interlayer dielectric film and a hard mask.

FIG. 1 is a schematic cross-sectional view of an exemplary semiconductor device having a barrier metal 1, metal wiring 2, a cap metal 3, a barrier dielectric film 4, low-dielectric-constant interlayer dielectric films 5 and a hard mask 6, which is cleaned with a liquid cleaning composition of the present invention. In this example, the barrier dielectric film 4, the low-dielectric-constant interlayer dielectric film 5 and the hard mask 6 are sequentially laminated in this order to form a predetermined pattern on a substrate having the barrier metal 1, the metal wiring 2, the cap metal 3 and the low-dielectric-constant interlayer dielectric film 5.

In general, a semiconductor device and a display element include:

a substrate material such as silicon, amorphous silicon, polysilicon or glass;

a dielectric material such as silicon oxide, silicon nitride, silicon carbide or a derivative thereof;

a barrier material such as tantalum, tantalum nitride, ruthenium or ruthenium oxide;

a wiring material such as copper, a copper alloy, cobalt or a cobalt alloy;

a compound semiconductor such as gallium-arsenic, gallium-phosphorus, indium-phosphorus, indium-gallium-arsenic or indium-aluminum-arsenic; and an oxide semiconductor such as chrome oxide.

As the low-dielectric-constant interlayer dielectric film, OCD (trade name, manufactured by Tokyo Ohka Kogyo) of a hydroxysilsesquioxane (HSQ) series or a methylsilsesquioxane (MSQ) series, Black Diamond (trade name, manufactured by Applied Materials), Aurora (trade name, manufactured by ASM International) or Coral (trade name, manufactured by Novellus Systems) of a carbon-doped silicon oxide (SiOC) series or the like may generally be used, although the low-dielectric-constant interlayer dielectric film should not be limited thereto.

As the barrier metal, tantalum, tantalum nitride, ruthenium, manganese, magnesium, cobalt, an oxide thereof or the like may generally be used, although the barrier metal should not be limited thereto.

As the barrier dielectric film, silicon nitride, silicon carbide, silicon carbonitride or the like may generally be used, although the barrier dielectric film should not be limited thereto.

As the hard mask to which the present invention can be applied, titanium, titanium nitride or the like may be used. In particular, titanium nitride is used with the present invention.

As the metal wiring to which the present invention can be applied, copper or a copper alloy, cobalt or a cobalt alloy as a cap metal formed on copper or a copper alloy, cobalt or a cobalt alloy, or the like may be used. Herein, a "copper alloy" refers to an alloy that contains copper at 50% or more, preferably 60% or more and more preferably 70% or more on a mass basis. A "cobalt alloy" refers to an alloy that contains cobalt at 50% or more, preferably 60% or more and more preferably 70% or more on a mass basis.

In one exemplary process for fabricating a semiconductor device, first, a barrier dielectric film, a low-dielectric-constant interlayer dielectric film, a hard mask and a photoresist are laminated on a substrate having a barrier metal, metal wiring, a low-dielectric-constant interlayer dielectric film, and if necessary a cap metal. Subsequently, the photoresist is subjected to selective exposure and development to form a photoresist pattern. Then, this photoresist pattern is transferred onto the hard mask by dry etch. Thereafter, the photoresist pattern is removed, and the low-dielectric-constant interlayer dielectric film and the barrier dielectric film are subjected to a dry etch treatment using the hard mask as an etch mask. Then, the hard mask is removed to obtain a semiconductor device having a desired metal wiring pattern. After forming a desired metal wiring pattern in such manner, the liquid cleaning composition of the present invention can favorably be used for removing the no longer needed hard mask.

In a preferable aspect of the present invention, the liquid cleaning composition of the present invention can be used to clean a semiconductor device so that a titanium nitride hard mask can be removed while suppressing damage to the metal wiring, thereby fabricating a high-precision high-quality semiconductor device at good yield.

EXAMPLES

Hereinafter, the present invention will be described more specifically by means of Examples and Comparative Examples. The present invention, however, should not be limited to these examples in any way.

Wafer Used

In this example, a "wafer with a titanium nitride film" that has a titanium nitride layer on a silicon wafer (in the table, expressed as TiN, manufactured by Advantech), a "wafer with a copper film" that has a copper layer on a silicon wafer (in the table, expressed as Cu, manufactured by Advantech) and a "wafer with a cobalt film" that has a cobalt layer on a silicon wafer (in the table, expressed as Co, manufactured by Advantech) were used.

Measurement of Thickness of Titanium Nitride Film

The thickness of the titanium nitride film of the wafer with the titanium nitride film was measured using X-ray fluorescent analyzer SEA1200VX, manufactured by SII NanoTechnology.

Measurement and Judgment of Etch Rate of Titanium Nitride

The etch rate of titanium nitride was evaluated by calculating a value, that was defined as the etch rate, by dividing the difference between the film thicknesses before and after treating the wafer with the titanium nitride film with the a cleaning solution by the treatment time. Titanium nitride etch rates of 100 Å/min (10 nm/min) or more were judged to be acceptable.

Measurement and Judgment of Etch Rates of Copper and Cobalt

The concentration of copper or cobalt in the cleaning solution after the treatment of the wafer with the copper or cobalt film was measured using Inductively Coupled Plasma-Optical Emission Spectrometer iCAP 6300 manufactured by Thermo Scientific. The amount of the dissolved copper or cobalt was calculated from the measured concentrations as well as the amount of the cleaning solution used, and the resultant was divided by the density to derive the volume of the dissolved copper or cobalt. The value calculated by dividing this volume of the dissolved copper or cobalt by the area of the wafer with the treated film and the treatment time was defined as the etch rate. Copper and cobalt etch rates of 0.1 Å/min (0.01 nm/min) or less were judged to be acceptable.

Examples 1-15

A wafer with a titanium nitride film was used to examine the removability of titanium nitride. Liquid cleaning compositions 1A-1O indicated in Table 1 were used for 3 minutes of immersion at temperatures indicated in Table 2, followed by rinsing with ultrapure water and drying by blowing nitrogen gas. The film thicknesses before and after the immersion were determined with an X-ray fluorescent analyzer to calculate the etch rates. The results are summarized in Table 2.

Next, wafers with a copper or cobalt film and the liquid cleaning compositions 1A-1O indicated in Table 1 were used to examine the anticorrosion states of copper and cobalt. After 30 minutes of immersion at temperatures indicated in Table 2, rinsing with ultrapure water and drying by blowing nitrogen gas were performed. The concentration of copper or cobalt in the cleaning solution after the immersion was determined with an inductively coupled plasma-optical emission spectrometer to calculate the etch rate. The results are summarized in Table 2.

When the liquid cleaning composition 1A of Example 1 (an aqueous solution comprising hydrogen peroxide at 15% by mass, potassium hydroxide at 0.1% by mass, diethylenetriamine penta(methylene phosphonic acid) (DTPP) at 0.05% by mass and aluminum sulfate at 0.01% by mass) was used, the etch rate of titanium nitride was 220 Å/min (22 nm/min) which was acceptable while the etch rates of copper and cobalt were 0.1 Å/min (0.01 nm/min) or less which were also judged to be acceptable.

When the liquid cleaning compositions of Examples 2-15 of the present invention shown in Table 2 were applied, the etch rates of titanium nitride were 100 Å/min (10 nm/min) or more which were acceptable, showing that titanium nitride could be removed well. Meanwhile, the etch rates of copper and cobalt were 0.1 Å/min (0.01 nm/min) or less, showing that damage to copper and cobalt could be suppressed.

Comparative Examples 1-21

The etch rates of titanium nitride, copper and cobalt were calculated respectively in the same manner as Examples 1-15 except that the cleaning solutions 2A-2U indicated in Table 3 were used for immersion of wafers with titanium nitride, copper and cobalt films at the temperatures indicated in Table 4.

Although the etch rates of titanium nitride were 100 Å/min (10 run/min) or more for Comparative examples 1, 3, 7, 8, 10-12 and 15-21, the etch rates of copper and cobalt exceeded 0.1 Å/min (0.01 nm/min). Although cleaning methods that used the cleaning solutions 2A, 2C, 2G, 2H, 2J, 2K, 2L, 2O, 2P, 2Q, 2R, 2S, 2T and 2U could remove titanium nitride well, they gave damage to copper and cobalt. Thus, they cannot be used for the purpose of the present invention.

The etch rates of titanium nitride were less than 100 Å/min (10 nm/min) for Comparative examples 2, 4, 5, 6, 9, 13 and 14. Since cleaning methods that used the cleaning solutions 2B, 2D, 2E, 2F, 2I, 2M and 2N could not remove titanium nitride well, they cannot be used for the purpose of the present invention.

TABLE 1

| Cleaning solution | Hydrogen peroxide Concentration % by mass | Potassium hydroxide Concentration % by mass | Aminopolymethylene phosphoric acid Type | Aminopolymethylene phosphoric acid Concentration % by mass | Compound having group 13 element Type | Compound having group 13 element Concentration % by mass | Other component Type | Other component Concentration % by mass | Water Concentration % by mass |
|---|---|---|---|---|---|---|---|---|---|
| 1A | 15 | 0.1 | DTPP | 0.005 | Al sulfate | 0.01 | — | — | 84.885 |
| 1B | 17 | 0.2 | DTPP | 0.0005 | Al sulfate | 0.01 | — | — | 82.7895 |
| 1C | 15 | 0.4 | PDTP | 0.001 | Al sulfate | 0.01 | — | — | 84.589 |
| 1D | 25 | 0.05 | PDTP | 0.002 | Al sulfate | 0.03 | — | — | 74.918 |
| 1E | 25 | 0.25 | PDTP | 0.002 | Al sulfate | 0.03 | — | — | 74.718 |
| 1F | 3 | 0.5 | PDTP | 0.002 | Al sulfate | 0.1 | — | — | 96.398 |
| 1G | 10 | 0.7 | PDTP | 0.002 | Al sulfate | 0.1 | — | — | 84.198 |
| 1H | 15 | 0.05 | PDTP | 0.0003 | Al sulfate | 0.0001 | — | — | 84.9496 |
| 1I | 15 | 0.1 | ATP | 0.005 | Al sulfate | 0.02 | — | — | 84.875 |
| 1J | 15 | 0.1 | EDTP | 0.01 | Al sulfate | 0.02 | — | — | 84.87 |
| 1K | 15 | 0.1 | DTPP | 0.005 | Al nitrate | 0.01 | — | — | 84.885 |
| 1L | 15 | 0.1 | DTPP | 0.005 | Al lactate | 0.01 | — | — | 84.885 |
| 1M | 15 | 0.1 | DTPP | 0.005 | Al chloride | 0.01 | — | — | 84.885 |
| 1N | 15 | 0.1 | DTPP | 0.003 | Ga nitrate | 0.07 | — | — | 84.827 |
| 1O | 15 | 0.1 | DTPP | 0.005 | Al sulfate | 0.01 | 3,5-dimethyl pyrazole | 0.3 | 84.585 |

In the table, DTPP stands for diethylenetriamine penta(methylene phosphonic acid), PDTP stands for 1,2-propylenediamine tetra(methylene phosphonic acid), ATP stands for aminotris(methylene phosphonic acid), and EDTP stands for ethylenediamine tetra(methylene phosphonic acid).

TABLE 2

| Example | Cleaning solution | Temperature °C. | Etch rate Å/min Titanium nitride Value | Titanium nitride Judgment | Cobalt Value | Cobalt Judgment | Copper Value | Copper Judgment |
|---|---|---|---|---|---|---|---|---|
| 1 | 1A | 50 | 220 | Acceptable | <0.1 | Acceptable | <0.1 | Acceptable |
| 2 | 1B | 50 | 250 | Acceptable | <0.1 | Acceptable | <0.1 | Acceptable |
| 3 | 1C | 50 | 250 | Acceptable | <0.1 | Acceptable | <0.1 | Acceptable |
| 4 | 1D | 50 | 170 | Acceptable | <0.1 | Acceptable | <0.1 | Acceptable |
| 5 | 1E | 40 | 200 | Acceptable | <0.1 | Acceptable | <0.1 | Acceptable |
| 6 | 1F | 60 | 170 | Acceptable | <0.1 | Acceptable | 0.1 | Acceptable |
| 7 | 1G | 50 | 240 | Acceptable | <0.1 | Acceptable | 0.1 | Acceptable |
| 8 | 1H | 50 | 160 | Acceptable | <0.1 | Acceptable | <0.1 | Acceptable |
| 9 | 1I | 50 | 190 | Acceptable | 0.1 | Acceptable | <0.1 | Acceptable |
| 10 | 1J | 50 | 170 | Acceptable | <0.1 | Acceptable | 0.1 | Acceptable |
| 11 | 1K | 50 | 170 | Acceptable | <0.1 | Acceptable | 0.1 | Acceptable |
| 12 | 1L | 50 | 180 | Acceptable | <0.1 | Acceptable | <0.1 | Acceptable |
| 13 | 1M | 50 | 180 | Acceptable | <0.1 | Acceptable | <0.1 | Acceptable |
| 14 | 1N | 50 | 130 | Acceptable | <0.1 | Acceptable | 0.1 | Acceptable |
| 15 | 1O | 50 | 170 | Acceptable | <0.1 | Acceptable | 0.1 | Acceptable |

TABLE 3

| Cleaning solution | Composition of cleaning solution (concentration: % by mass) |
|---|---|
| 2A | Hydrogen peroxide 18%, potassium hydroxide 0.12%, PDTP 0.003%, water 81.877% |
| 2B | Hydrogen peroxide 0.35%, 2-(2-aminoethylamino)ethanol 2%, TMAH 1.5%, EDTA 1.2%, water 94.95% |
| 2C | Hydrogen peroxide 3%, potassium hydroxide 2%, sulfolane 70%, DTPP 1%, water 24% |
| 2D | Sulfuric acid 98%, water 2% |
| 2E | Hexafluorosilicic acid 2%, nitric acid 0.1%, benzotriazole 0.5%, water 97.4% |
| 2F | Hydrochloric acid 3.4%, tetrazole 0.5%, water 96.1% |
| 2G | Hydrogen peroxide 13%, HF 0.2%, sulfuric acid 1%, DGME 60%, 1-methylimidazole 0.5%, water 25.3% |
| 2H | Hydrogen peroxide 10%, TMAH 1.5%, EDTA 1.5%, tetrazole 0.6%, water 86.4% |
| 2I | Ammonium fluoride 1%, ammonium nitrate 2%, benzotriazole 0.5%, water 96.5% |
| 2J | Hydrogen peroxide 17%, potassium hydroxide 0.2%, DTPP 0.005%, 2-ethyl-4-methylimidazole 0.5%, water 82.295% |
| 2K | Hydrogen peroxide 17%, potassium hydroxide 0.2%, DTPP 0.007%, 3,5-dimethylpyrazole 0.5%, water 82.293% |
| 2L | Hydrogen peroxide 15%, potassium hydroxide 0.1%, DTPP 0.005%, water 84.895% |
| 2M | Potassium hydroxide 0.1%, DTPP 0.005%, Al sulfate 0.01%, water 99.885% |
| 2N | Hydrogen peroxide 15%, DTPP 0.005%, Al sulfate 0.01%, water 84.985% |
| 2O | Hydrogen peroxide 25%, potassium hydroxide 0.05%, PDTP 0.002%, water 74.948% |
| 2P | Hydrogen peroxide 25%, potassium hydroxide 0.25%, PDTP 0.002%, water 74.748% |
| 2Q | Hydrogen peroxide 3%, potassium hydroxide 0.5%, PDTP 0.002%, water 96.498% |
| 2R | Hydrogen peroxide 15%, potassium hydroxide 0.1%, ATP 0.005%, water 84.895% |
| 2S | Hydrogen peroxide 15%, potassium hydroxide 0.1%, EDTP 0.01%, water 84.89% |
| 2T | Hydrogen peroxide 15%, potassium hydroxide 0.1%, DTPP 0.005%, sulfuric acid 0.01%, water 84.885% |
| 2U | Hydrogen peroxide 15%, potassium hydroxide 0.1%, DTPP 0.005%, nitric acid 0.01%, water 84.885% |

In the table, DTPP stands for diethylenetriamine penta(methylene phosphonic acid), PDTP stands for 1,2-propylenediamine tetra(methylene phosphonic acid), ATP stands for aminotris(methylene phosphonic acid), EDTP stands for ethylenediamine tetra(methylene phosphonic acid), TMAH stands for tetramethyl ammonium hydroxide, EDTA stands for ethylenediamine tetraacetic acid, and DGME stands for diethylene glycol monomethyl ether.

TABLE 4

| Comparative example | Cleaning solution | Temperature °C. | Titanium nitride Value | Titanium nitride Judgment | Cobalt Value | Cobalt Judgment | Copper Value | Copper Judgment |
|---|---|---|---|---|---|---|---|---|
| 1 | 2A | 60 | 330 | Acceptable | 2 | Failure | 0.4 | Failure |
| 2 | 2B | 50 | 5 | Failure | <0.1 | Acceptable | >100 | Failure |
| 3 | 2C | 50 | 180 | Acceptable | 0.4 | Failure | 3 | Failure |
| 4 | 2D | 70 | <1 | Failure | 30 | Failure | 70 | Failure |
| 5 | 2E | 25 | 2 | Failure | 2 | Failure | 0.9 | Failure |
| 6 | 2F | 60 | <1 | Failure | 9 | Failure | 20 | Failure |
| 7 | 2G | 60 | 100 | Acceptable | 60 | Failure | >100 | Failure |
| 8 | 2H | 60 | 100 | Acceptable | 50 | Failure | >100 | Failure |
| 9 | 2I | 60 | 2 | Failure | <0.1 | Acceptable | <0.1 | Acceptable |
| 10 | 2J | 50 | 220 | Acceptable | 0.9 | Failure | 1 | Failure |
| 11 | 2K | 50 | 210 | Acceptable | 1 | Failure | 0.5 | Failure |
| 12 | 2L | 50 | 170 | Acceptable | 1 | Failure | 0.3 | Failure |
| 13 | 2M | 50 | <1 | Failure | 0.5 | Failure | 0.7 | Failure |
| 14 | 2N | 50 | <1 | Failure | 50 | Failure | 10 | Failure |
| 15 | 2O | 50 | 190 | Acceptable | 2 | Failure | 0.2 | Failure |
| 16 | 2P | 40 | 120 | Acceptable | 0.6 | Failure | 0.2 | Failure |
| 17 | 2Q | 60 | 170 | Acceptable | 0.3 | Failure | 0.4 | Failure |
| 18 | 2R | 50 | 170 | Acceptable | 1 | Failure | 0.3 | Failure |
| 19 | 2S | 50 | 160 | Acceptable | 3 | Failure | 0.2 | Failure |
| 20 | 2T | 50 | 170 | Acceptable | 1 | Failure | 0.2 | Failure |
| 21 | 2U | 50 | 170 | Acceptable | 1 | Failure | 0.2 | Failure |

REFERENCE SIGNS LIST

1: Barrier metal
2: Metal wiring
3: Cap metal
4: Barrier dielectric film
5: Low-dielectric-constant interlayer dielectric film
6: Hard mask

The invention claimed is:

1. A liquid cleaning composition for removing a titanium nitride hard mask while suppressing corrosion of one or more types of materials selected from the group consisting of a material containing a cobalt element and a material containing a copper element, the composition comprising hydrogen peroxide at 1-30% by mass, potassium hydroxide at 0.01-1% by mass, aminopolymethylene phosphonic acid at 0.0001-0.05% by mass, a compound having a group 13 element at 0.00005-0.5% by mass and water.

2. The liquid cleaning composition according to claim 1, wherein the compound having a group 13 element is one or more types selected from the group consisting of salts of aluminum and salts of gallium.

3. The liquid cleaning composition according to claim 1, wherein the compound having a group 13 element is one or more types selected from the group consisting of aluminum sulfate, aluminum nitrate, aluminum chloride, aluminum lactate and gallium nitrate.

4. The liquid cleaning composition according to claim 1, wherein the aminopolymethylene phosphonic acid is one or more types selected from the group consisting of aminotris (methylene phosphonic acid), ethylenediamine tetra(methylene phosphonic acid), diethylenetriamine penta(methylene phosphonic acid) and 1,2-propylenediamine tetra(methylene phosphonic acid).

5. The liquid cleaning composition according to claim 1, wherein the material containing a cobalt element is cobalt or a cobalt alloy and the material containing a copper element is copper or a copper alloy.

6. A semiconductor device cleaning method for removing a titanium nitride hard mask while suppressing corrosion of one or more types of materials selected from the group consisting of a material containing a cobalt element and a material containing a copper element, where the semiconductor device has at least one or more types of materials selected from the group consisting of a material containing a cobalt element and a material containing a copper element as well as the titanium nitride hard mask, the method comprising bringing a liquid cleaning composition comprising hydrogen peroxide at 1-30% by mass, potassium hydroxide at 0.01-1% by mass, aminopolymethylene phosphonic acid at 0.0001-0.05% by mass, a compound having a group 13 element at 0.00005-0.5% by mass and water into contact with the semiconductor device.

7. The cleaning method according to claim 6, wherein the compound having a group 13 element is one or more types selected from the group consisting of salts of aluminum and salts of gallium.

8. The cleaning method according to claim 6, wherein the compound having a group 13 element is one or more types selected from the group consisting of aluminum sulfate, aluminum nitrate, aluminum chloride, aluminum lactate and gallium nitrate.

9. The cleaning method according to claim 6, wherein the aminopolymethylene phosphonic acid is one or more types selected from the group consisting of aminotris(methylene phosphonic acid), ethylenediamine tetra(methylene phosphonic acid), diethylenetriamine penta(methylene phosphonic acid) and 1,2-propylenediamine tetra(methylene phosphonic acid).

10. The cleaning method according to claim 6, wherein the material containing a cobalt element is cobalt or a cobalt alloy and the material containing a copper element is copper or a copper alloy.

11. A method for fabricating a semiconductor device having one or more types of materials selected from the group consisting of a material containing a cobalt element and a material containing a copper element, the method comprising removing a titanium nitride hard mask while suppressing corrosion of one or more types of materials selected from the group consisting of a material containing a cobalt element and a material containing a copper element by contacting said titanium nitride hard mask with a liquid cleaning composition comprising hydrogen peroxide at 1-30% by mass, potassium hydroxide at 0.01-1% by mass, aminopolymethylene phosphonic acid at 0.0001-0.05% by mass, a compound having a group 13 element at 0.00005-0.5% by mass and water.

12. The fabrication method according to claim 11, wherein the compound having a group 13 element is one or more types selected from the group consisting of salts of aluminum and salts of gallium.

13. The fabrication method according to claim 11, wherein the compound having a group 13 element is one or more types selected from the group consisting of aluminum sulfate, aluminum nitrate, aluminum chloride, aluminum lactate and gallium nitrate.

14. The fabrication method according to claim 11, wherein the aminopolymethylene phosphonic acid is one or more types selected from the group consisting of aminotris (methylene phosphonic acid), ethylenediamine tetra(methylene phosphonic acid), diethylenetriamine penta(methylene phosphonic acid) and 1,2-propylenediamine tetra(methylene phosphonic acid).

15. The fabrication method according to claim 11, wherein the material containing a cobalt element is cobalt or a cobalt alloy and the material containing a copper element is copper or a copper alloy.

* * * * *